United States Patent
Zhang et al.

(10) Patent No.: US 11,128,259 B2
(45) Date of Patent: Sep. 21, 2021

(54) POWER AMPLIFICATION APPARATUS, REMOTE RADIO UNIT, AND BASE STATION

(71) Applicant: HUAWEI TECHNOLOGIES CO., LTD., Guangdong (CN)

(72) Inventors: Shunzhong Zhang, Shanghai (CN); Lipeng Zhang, Shanghai (CN); Zhonghua Cai, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/521,517

(22) Filed: Jul. 24, 2019

(65) Prior Publication Data

US 2019/0348952 A1    Nov. 14, 2019

Related U.S. Application Data

(63) Continuation of application No. PCT/CN2017/072652, filed on Jan. 25, 2017.

(51) Int. Cl.
*H03F 1/02* (2006.01)
*H03F 3/24* (2006.01)
(Continued)

(52) U.S. Cl.
CPC ......... *H03F 1/0222* (2013.01); *H03F 1/0288* (2013.01); *H03F 3/19* (2013.01);
(Continued)

(58) Field of Classification Search
CPC ........ H03F 1/0222; H03F 1/0288; H03F 3/19; H03F 3/211; H03F 3/245; H03F 2200/102; H03F 2200/451; H03F 3/20
(Continued)

(56) References Cited

U.S. PATENT DOCUMENTS 8,274,332 B2 *  9/2012  Cho .................. H03F 3/211
                                                330/295
2011/0018628 A1   1/2011  Yang et al.
(Continued)

FOREIGN PATENT DOCUMENTS

CN    101527545 A    9/2009
CN    102186264 A    9/2011
(Continued)

OTHER PUBLICATIONS

Yuan Fangbiao et al, High Efficiency Envelope Tracking Power Amplifier, Semiconductor Technology, Jul. 2015. total 5 pages. With English abstract.
(Continued)

*Primary Examiner* — Hieu P Nguyen
(74) *Attorney, Agent, or Firm* — Womble Bond Dickinson (US) LLP

(57) ABSTRACT

A power amplification apparatus, a remote radio unit, and a base station are provided to improve power amplification efficiency. The power amplification apparatus includes an envelope modulator, a main power amplifier, and a first auxiliary power amplifier. The envelope modulator is configured to obtain an envelope voltage based on a received envelope signal and output the envelope voltage to the drain of the main power amplifier. The main power amplifier is connected to the envelope modulator and configured to use the envelope voltage as an operating voltage, and is connected to the first auxiliary power amplifier, to output the envelope voltage to a drain of the first auxiliary power amplifier. The first auxiliary power amplifier is configured to use the envelope voltage received from the main power amplifier as an operating voltage.

20 Claims, 8 Drawing Sheets

(51) Int. Cl.
*H03F 3/19* (2006.01)
*H03F 3/21* (2006.01)

(52) U.S. Cl.
CPC ............ *H03F 3/211* (2013.01); *H03F 3/245* (2013.01); *H03F 2200/102* (2013.01); *H03F 2200/451* (2013.01)

(58) Field of Classification Search
USPC .................. 330/295, 124 R, 84, 286, 53–54
See application file for complete search history.

(56) References Cited

U.S. PATENT DOCUMENTS

| | | |
|---|---|---|
| 2014/0084998 A1 | 3/2014 | Khesbak |
| 2015/0263678 A1 | 9/2015 | Kunihiro |
| 2015/0340996 A1 | 11/2015 | Ge et al. |
| 2016/0087589 A1 | 3/2016 | Lehtola |
| 2016/0218679 A1 | 7/2016 | Jang et al. |

FOREIGN PATENT DOCUMENTS

| | | |
|---|---|---|
| CN | 103430603 A | 12/2013 |
| CN | 105932970 A | 9/2016 |
| CN | 105934933 B | 6/2020 |
| EP | 1962369 B1 | 6/2014 |
| JP | 2014517650 A | 7/2014 |
| WO | 2005081399 A1 | 9/2005 |
| WO | 2014069451 A1 | 5/2014 |
| WO | 2016023144 A1 | 2/2016 |
| WO | 2016144542 A1 | 9/2016 |

OTHER PUBLICATIONS

Jinsung Choi et al: "Optimized Envelope Tracking Operation of Daherty Power Amplifier for High Efficiency Over an Extended Dynamic Range", IEEE Transactions on Microwave Theory and Techniques, Plenum, USA, vol. 57, na. 6, Jun. 10, 2009, pp. 1508-1515, XP011257253, 8 pages.

* cited by examiner

POWER AMPLIFICATION APPARATUS, REMOTE RADIO UNIT, AND BASE STATION

CROSS-REFERENCE TO RELATED APPLICATIONS

This application is a continuation of International Application No. PCT/CN2017/072652, filed on Jan. 25, 2017, the disclosure of which is hereby incorporated by reference in its entirety.

TECHNICAL FIELD

This application relates to the field of communications technologies, and in particular, to a power amplification apparatus, a remote radio unit, and a base station.

BACKGROUND

A power amplifier (PA) is an important component in a wireless communications base station. Efficiency of the power amplifier determines power consumption, a size, a thermo design, and the like of the base station. Currently, to improve spectrum utilization efficiency, various modulation signals in different standards, for example, orthogonal frequency division multiplexing (OFDM), code division multiple access (CDMA), and time division multiple access (TDMA), are used in wireless communication. According to stipulations in related protocols, signals in the standards have different peak-to-average power ratios (PAPR). For example, a peak-to-average power ratio of an OFDM signal is 10 dB to 12 dB. Signals with a high peak-to-average power ratio have a higher requirement for the power amplifier in the base station. The power amplifier in the base station uses a power back-off method to amplify these signals with a high peak-to-average power ratio without distortion. To be specific, the power amplifier operates in a class A state or a class AB state, stays away from a saturation region, and enters a linear operating region, thereby improving linearity of the power amplifier. However, based on a feature of a power transistor, this method causes a great decrease in power amplification efficiency, and with a same output power, energy consumption of the base station is greatly increased.

To improve power amplification efficiency when a signal is amplified by using the power back-off method, it is proposed in the prior art to combine envelope tracking (ET) with a Doherty amplifier. A back-off efficiency advantage of the Doherty amplifier is used, to improve power amplification efficiency of a signal with a high peak-to-average power ratio during back-off. As shown in FIG. 1, a main power amplifier of a Doherty amplifier is connected to an envelope modulator. The envelope modulator performs envelope tracking on a signal, and provides an operating voltage of the main power amplifier. In addition, a fixed voltage is used to supply power to an auxiliary power amplifier. An output end of the main power amplifier and an output end of the auxiliary power amplifier are connected to each other after respectively passing through a high-pass blocking capacitor. The high-pass blocking capacitor can avoid mutual interference between an output signal of the main power amplifier and an output signal of the auxiliary power amplifier. The back-off efficiency advantage of the Doherty amplifier may be used in the technology, to improve the efficiency of the signal with a high peak-to-average power ratio during back-off. However, when a ratio of a voltage of the main power amplifier to a voltage of the auxiliary power amplifier is larger, symmetry of the Doherty amplifier is reduced, and there is a larger dent in efficiency. Therefore, there is a limited improvement in efficiency. In addition, a breakdown voltage of a power transistor of the auxiliary power amplifier is limited, and the fixed voltage of the auxiliary power amplifier cannot be configured very high. Therefore, a saturation power of the power amplifier cannot further be increased.

SUMMARY

This application provides embodiments of a power amplification apparatus, a remote radio unit, and a base station, to resolve a problem of a limited improvement in power amplification efficiency during operation of a power amplification apparatus based on an existing structure.

A first aspect provides a power amplification apparatus. An envelope voltage is transferred between two power transistors, so that an envelope voltage output by an envelope modulator is transferred from a main power amplifier to an auxiliary power amplifier. The main power amplifier and the auxiliary power amplifier both use the envelope voltage output by the envelope modulator as an operating voltage. The envelope voltage varies by tracking an amplitude variation of an envelope signal, so that the power amplification apparatus operates in a Doherty amplifier mode of envelope tracking. Because operating voltages of the main power amplifier and the auxiliary power amplifier can be adjusted simultaneously, symmetry of the power amplification apparatus is improved, and efficiency loss is not likely to occur. An efficiency advantage of a Doherty amplifier during power back-off is used in combination with an envelope tracking technology, so that a saturation power of the power amplifier is increased, efficiency of the power amplification apparatus is improved, and in particular, in an operating state of amplifying a signal with a high power and a high peak-to-average power ratio, relatively high efficiency can be achieved.

In one embodiment, the power amplification apparatus includes an envelope modulator, a main power amplifier, and a first auxiliary power amplifier. The envelope modulator is connected to a drain of the main power amplifier, and is configured to: obtain an envelope voltage based on a received envelope signal, and output the envelope voltage to the drain of the main power amplifier. The main power amplifier is configured to perform amplification processing on a signal input through a gate of the main power amplifier. The main power amplifier is connected to the envelope modulator, to use the envelope voltage received from the envelope modulator as an operating voltage. The main power amplifier is connected to the first auxiliary power amplifier, and is configured to output the envelope voltage to a drain of the first auxiliary power amplifier. The first auxiliary power amplifier is configured to perform amplification processing on a signal input through a gate of the first auxiliary power amplifier. The first auxiliary power amplifier is connected to the main power amplifier, to use the envelope voltage received from the main power amplifier as an operating voltage. The envelope voltage may be transferred to both the main power amplifier and at least one auxiliary power amplifier by using one envelope modulator, so that an area and costs of the power amplification apparatus are reduced. Components in the power amplification apparatus are positioned more flexibly, and a high-pass blocking capacitor is removed, so that it is easier to construct the power amplification apparatus.

In one embodiment, the power amplification apparatus further includes a second auxiliary power amplifier, configured to perform amplification processing on a signal input through a gate of the second auxiliary power amplifier. The second auxiliary power amplifier is connected to the first auxiliary power amplifier, to use the envelope voltage received from the first auxiliary power amplifier as an operating voltage. The first auxiliary power amplifier is connected to the second auxiliary power amplifier, and outputs the envelope voltage to the second auxiliary power amplifier.

In one embodiment, the power amplification apparatus further includes the second auxiliary power amplifier to an $N^{th}$ auxiliary power amplifier, where N is an integer greater than or equal to three. Each of the second auxiliary power amplifier to the $(N-1)^{th}$ auxiliary power amplifier is configured to perform amplification processing on a signal input through a gate of each auxiliary power amplifier. The auxiliary power amplifier is connected to a previous auxiliary power amplifier and a next auxiliary power amplifier, and is configured to: receive the envelope voltage output by the previous auxiliary power amplifier, output the envelope voltage to the next auxiliary power amplifier, and use the envelope voltage as an operating voltage. The $N^{th}$ auxiliary power amplifier is configured to perform amplification processing on a signal input through a gate of the $N^{th}$ auxiliary power amplifier. The $N^{th}$ auxiliary power amplifier is connected to the $(N-1)^{th}$ auxiliary power amplifier, to use the envelope voltage received from the $(N-1)^{th}$ auxiliary power amplifier as an operating voltage. Because a quantity of auxiliary power amplifiers is increased, a larger output power can be generated, and device performance can further be improved.

In one embodiment, the power amplification apparatus further includes a filter circuit, connected to the drain of the first auxiliary power amplifier, and configured to filter the envelope voltage received by the first auxiliary power amplifier. The filter circuit filters and/or shapes a signal of the envelope voltage, so that envelope voltages of the first auxiliary power amplifier and the main power amplifier are closer or equal. In one embodiment, when the power amplification apparatus includes two or more auxiliary power amplifiers, for example, includes the first auxiliary power amplifier to the $N^{th}$ auxiliary power amplifier (where N is greater than or equal to 2), any one or more of the two or more auxiliary power amplifiers may be connected to a filter link, to filter and/or shape the envelope voltage.

In one embodiment, the filter circuit includes at least one of an inductor, a resistor, and a capacitor. The filter circuit is grounded.

In one embodiment, an output end of the main power amplifier is connected to an output end of the first auxiliary power amplifier by using a first microstrip, and the first microstrip is configured to transmit the envelope voltage. An existing transmission line element in an existing system is used to transmit the envelope voltage, to transmit the envelope voltage between power transistors without increasing complexity of a system structure.

In one embodiment, the power amplification apparatus further includes a frequency converter, connected to both the gate of the main power amplifier and the gate of the first auxiliary power amplifier, and configured to: convert a frequency of an input signal into a frequency in an operating frequency range the same as those of the main power amplifier and the first auxiliary power amplifier, to obtain a radio frequency signal, and output the radio frequency signal to each of the main power amplifier and the first auxiliary power amplifier. In one embodiment, when the power amplification apparatus includes another auxiliary power amplifier (for example, the second auxiliary power amplifier), the frequency converter may further be connected to the another auxiliary power amplifier, to output the radio frequency signal to the another auxiliary power amplifier.

In one embodiment, the power amplification apparatus further includes a power divider, connected to both the gate of the main power amplifier and the gate of the first auxiliary power amplifier, and configured to: divide the radio frequency signal into at least two signals, and respectively output two of the at least two signals to the main power amplifier and the first auxiliary power amplifier.

In one embodiment, an output end of the first auxiliary power amplifier is connected to an output end of the second auxiliary power amplifier by using a second microstrip, and the second microstrip is configured to transmit the envelope voltage.

In one embodiment, the envelope modulator may further be connected to any auxiliary power amplifier, and transfer the envelope voltage to the main power amplifier by using the auxiliary power amplifier, so that a layout of the power amplification apparatus is more flexible. In one embodiment, the envelope modulator is connected to the drain of the first auxiliary power amplifier, and is configured to: obtain an envelope voltage based on a received envelope signal, and output the envelope voltage to the drain of the first auxiliary power amplifier. The first auxiliary power amplifier is configured to perform amplification processing on the signal input through the gate of the first auxiliary power amplifier. The first auxiliary power amplifier is connected to the envelope modulator, to use the envelope voltage received from the envelope modulator as an operating voltage. The first auxiliary power amplifier is connected to the main power amplifier, and is configured to output the envelope voltage to the drain of the main power amplifier. The main power amplifier is configured to perform amplification processing on the signal input through the gate of the main power amplifier. The main power amplifier is connected to the first auxiliary power amplifier, to use the envelope voltage received from the first auxiliary power amplifier as an operating voltage.

In one embodiment, the main power amplifier is connected to the filter circuit, and is configured to filter and shape a signal of the envelope voltage received by the main power amplifier, to improve an envelope waveform.

According to a second aspect, the embodiments of this application further provide a remote radio unit (RRU), including the power amplification apparatus according to the first aspect or any possible design.

In one embodiment, the remote radio unit may further include a processor, configured to output an envelope signal to the power amplification apparatus.

In one embodiment, the RRU receives the envelope signal sent by a baseband unit (BBU).

In one embodiment, the remote radio unit may further include a communications interface, configured to directly or indirectly communicate with another apparatus in a base station.

A third aspect provides a base station, including the remote radio unit (RRU) according to the second aspect.

In one embodiment, the base station further includes a baseband unit that can directly or indirectly communicate with the remote radio unit.

BRIEF DESCRIPTION OF DRAWINGS

FIG. 4b-1 and FIG. 4b-2 are a fourth schematic structural diagram of a power amplifier according to an embodiment of this application;

DESCRIPTION OF EMBODIMENTS

The following further describes this application with reference to the accompanying drawings.

Solutions described in embodiments of this application are applicable to various different communications systems, for example, a second-generation (2G) communications system, a third-generation (3G) communications system, a long term evolution (LTE) system, or a fifth-generation (5G) communications system, and more possible subsequent evolved communications systems.

A power amplification apparatus provided in the embodiments of this application may be integrated in any network element device such as a base station that needs to amplify a power of a radio signal. The power amplification apparatus provided in the embodiments of this application may operate in a radio frequency part of the base station, for example, may be arranged in a remote radio unit (RRU) of the base station. The base station is an apparatus that is deployed in a radio access network and that is configured to provide a terminal with a wireless communication function. The base station may include various forms of macro base stations, micro base stations, relay stations, access points, and the like. When different communications systems are used, the apparatus having a function of the base station may have different names. For example, the apparatus may be an evolved node B (eNB, or eNodeB) in an LTE communications system, may be a node B in a 3G communications system, and may be a base station (BS) in a 2G communications system. Alternatively, there are similar devices in more possible subsequent communications systems.

The following describes, with reference to the accompanying drawings, the power amplification apparatus, a remote radio unit, and a base station provided in the embodiments of this application in detail.

Figure 2:
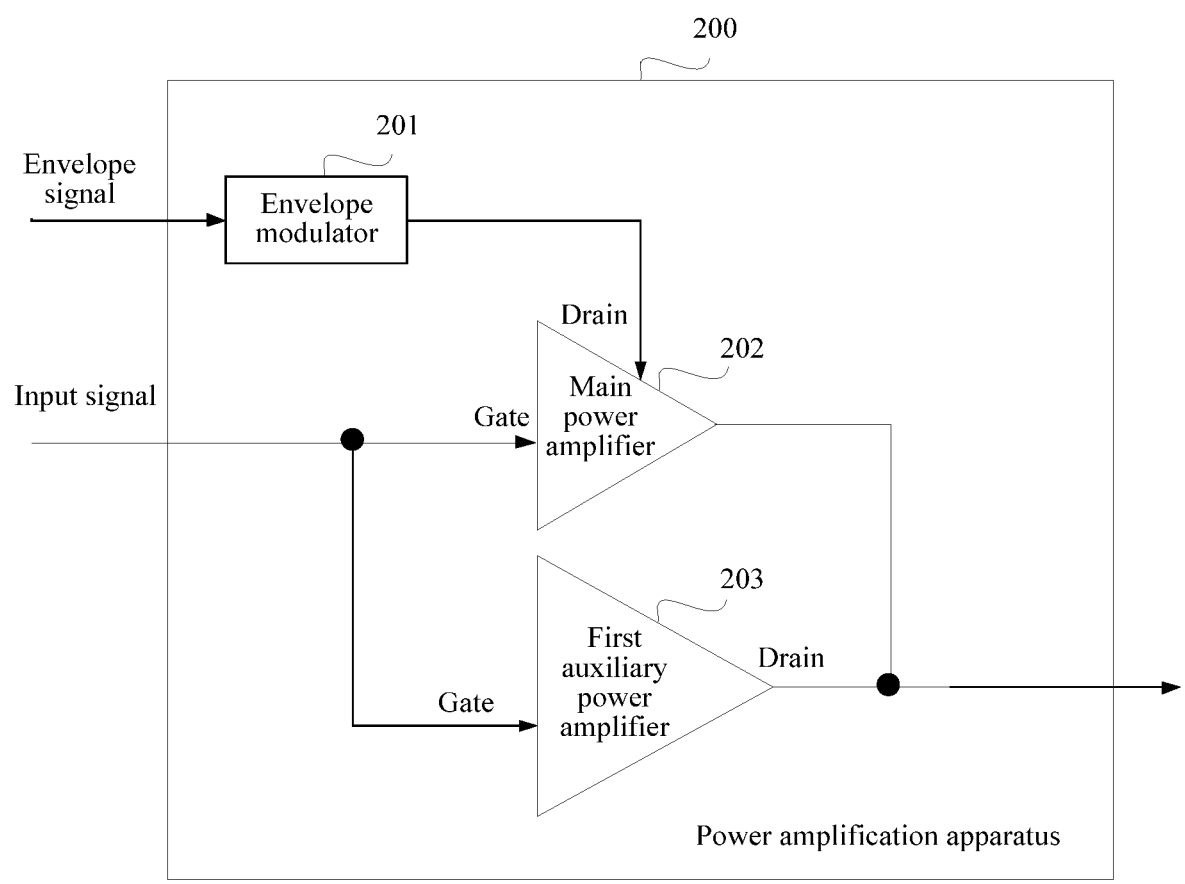
FIG. 2 is a first schematic structural diagram of a power amplifier according to an embodiment of this application.

As shown in FIG. 2, a power amplification apparatus 200 provided in an embodiment of this application includes an envelope modulator 201, a main power amplifier 202, and a first auxiliary power amplifier 203.

The envelope modulator 201 is connected to a drain of the main power amplifier 202, and is configured to: obtain an envelope voltage based on a received envelope signal, and output the envelope voltage to the drain of the main power amplifier 202.

The main power amplifier 202 is configured to perform amplification processing on a signal input through a gate of the main power amplifier 202. The main power amplifier 202 is connected to the envelope modulator 201, to use the envelope voltage received from the envelope modulator 201 as an operating voltage in an operating state. The main power amplifier 202 is connected to the first auxiliary power amplifier 203, and outputs the envelope voltage to a drain of the first auxiliary power amplifier 203.

The first auxiliary power amplifier 203 is configured to perform amplification processing on a signal input through a gate of the first auxiliary power amplifier 203. The first auxiliary power amplifier 203 is connected to the main power amplifier 202, to use the envelope voltage received from the main power amplifier 202 as an operating voltage in an operating state.

The envelope signal is a signal that may be used to track the operating voltage of the main power amplifier 202. To be specific, the envelope modulator 201 generates an envelope voltage that can track a magnitude variation of the envelope signal, to supply power to the main power amplifier 202 in place of a fixed voltage, so that the main power amplifier 202 can stay in an approximately saturated operating state. The envelope signal may be obtained by performing function processing on an original envelope signal of a to-be-amplified radio frequency signal. A function for converting the original envelope signal into the envelope signal may be preset based on requirements such as an amplitude and a phase of the output envelope signal, for example, may be a linear function, a quadratic function, a cubic function, or the like. This is not particularly limited in this embodiment of this application.

During actual application, the envelope modulator 201 may be a unit circuit, and includes a known circuit component in the prior art. A specific circuit structure of the envelope modulator is not particularly limited in this embodiment of the present invention.

In one embodiment, the envelope modulator 201 may determine an amplitude of the envelope voltage based on a modulator control signal. Parameters such as a type, a phase, and an amplitude of the modulator control signal may be determined based on performance of the power amplification apparatus 200, and may be adjusted based on an operating state of the power amplification apparatus 200. This is not particularly limited in this embodiment of this application. The modulator control signal may be a digital signal.

A to-be-amplified signal is a radio frequency signal, and may be obtained by converting a baseband data signal. For a specific conversion process, refer to the prior art, and details are not described herein again. For example, in a distributed base station, the baseband data signal may be generated after being processed by an intermediate frequency module in the RRU and a transceiver module, and is respectively transmitted to the main power amplifier 202 and the first auxiliary power amplifier 203 in the power amplification apparatus 200 provided in this embodiment of this application.

In one embodiment, to-be-amplified signals input through gates of the main power amplifier 202 and the first auxiliary power amplifier 203 may be a same radio frequency signal, or may be signals that can represent a same radio frequency signal after superimposition, or may be in another combined or divided form of radio frequency signals. This is not limited in this application.

It should be noted that there is no high-pass blocking capacitor between the main power amplifier 202 and the first auxiliary power amplifier 203. A low frequency signal may be alternatively directly transmitted from the main power amplifier 202 to the first auxiliary power amplifier 203.

Figure 3:
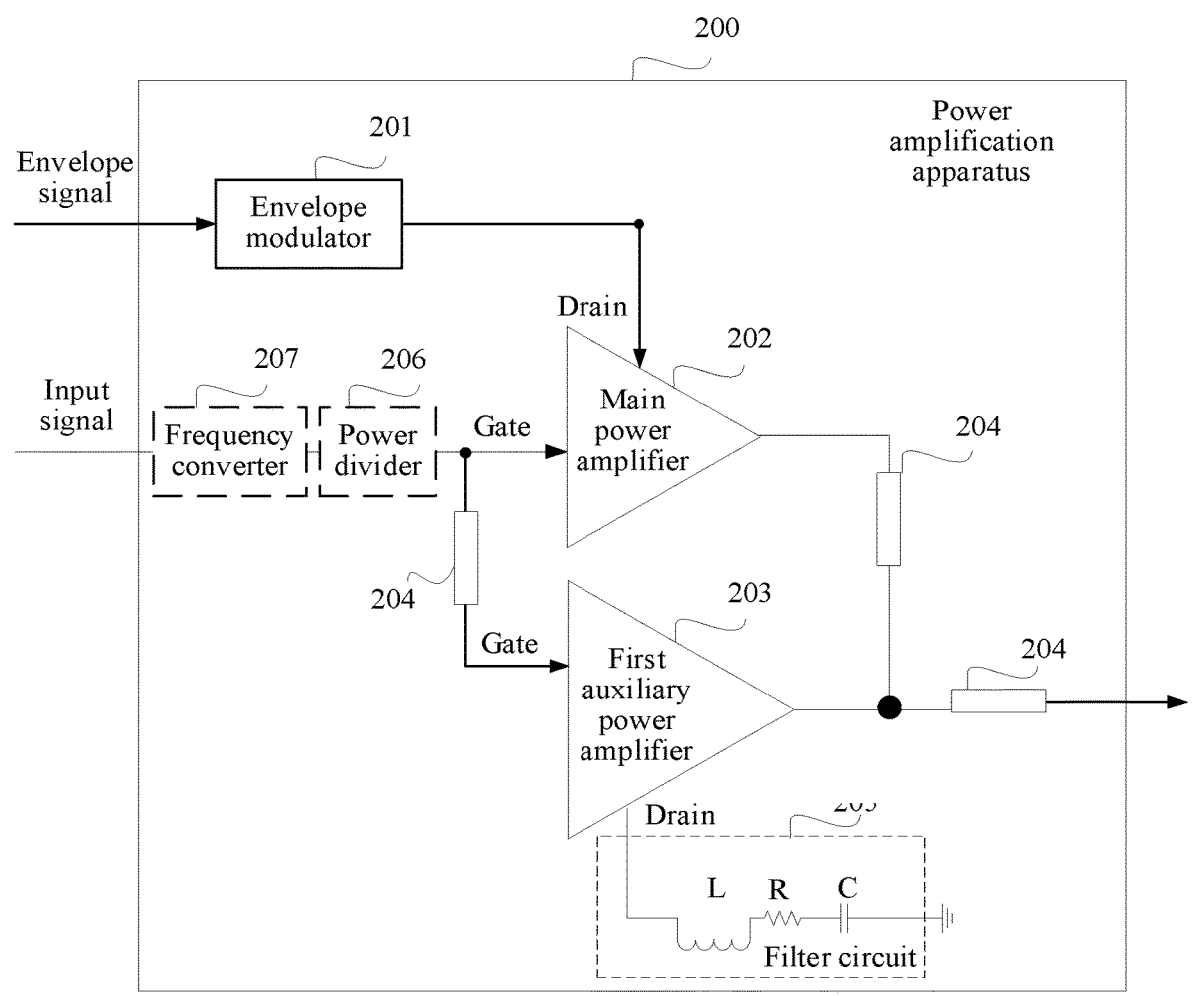
FIG. 3 is a second schematic structural diagram of a power amplifier according to an embodiment of this application.

As shown in FIG. 3, a microstrip 204 is provided between an output end of the main power amplifier 202 and an output end of the first auxiliary power amplifier 203, and may be marked as a first microstrip 204. The first microstrip 204 is connected between the two power amplifiers, is configured to transmit the envelope voltage, and also adjusts impedance. In this embodiment of this application, the drain of the main power amplifier 202 may be equivalent to the output end of the main power amplifier 202. Alternatively, it may be considered that the output end of the main power amplifier 202 is an output interface formed by an electrode area of the drain of the main power amplifier 202 through network conversion or combination. Similarly, a drain and an input end of an auxiliary power amplifier (for example, the first auxiliary power amplifier to an $N^{th}$ auxiliary power amplifier) in this embodiment of this application also have relationship similar to that in the foregoing.

In one embodiment, the first microstrip 204 may be a quarter-wave ($\lambda/4$) transmission line, where $\lambda$, represents a wavelength of a radio frequency signal.

The main power amplifier 202 receives the envelope voltage output by the envelope modulator 201, and outputs the envelope voltage to the first auxiliary power amplifier 203. Therefore, an operating voltage of the first auxiliary power amplifier is also a varied voltage tracking an amplitude variation of the envelope signal. In this case, the power amplification apparatus 200 is a Doherty amplifier using envelope tracking, to be specific, operates in a common state of the envelope tracking and the Doherty amplifier. In the operating mode, the power amplification apparatus 200 desirably amplifies a modulation signal with a high power and a high peak-to-average power ratio.

In one embodiment, the power amplification apparatus 200 further includes a filter circuit 205. The filter circuit 205 is connected to the first auxiliary power amplifier 203, and may be connected to the drain of the first auxiliary power amplifier 203. The filter circuit 205 includes at least one of an inductor, a resistor, and a capacitor. In one embodiment, filter circuit 205 may be an LRC circuit. Components in the filter circuit 205 may be connected in any form. To be specific, the components may be connected in a plurality of manners. For example, in the filter circuit 205, the inductor may be connected to the capacitor in series. For another example, in the filter circuit 205, the resistor may be connected to the capacitor in series. For still another example, in the filter circuit 205, a first branch may be connected to a second branch in parallel, the first branch includes the inductor and the capacitor connected in series, and the second branch includes the resistor and the capacitor connected in series. For still another example, in the filter circuit 205, the inductor, the resistor, and the capacitor may be connected in series. The filter circuit 205 is grounded. In this embodiment of this application, the filter circuit 205 shown in FIG. 3 to FIG. 5 in which the inductor, the resistor, and the capacitor are connected in series may be used as an example. It may be understood that the filter circuit 205 shown in FIG. 3 to FIG. 5 may have a connection manner in another form. The filter circuit 205 is configured to filter and shape a signal of the envelope voltage received by the first auxiliary power amplifier 203, to improve an envelope waveform, thereby improving overall digital pre-distortion (DPD) calibration performance of a system.

In one embodiment, as shown in FIG. 3, the power amplification apparatus 200 may further include a frequency converter 207, connected to both the gate of the main power amplifier 202 and the gate of the first auxiliary power amplifier 203, and configured to convert a frequency of an intermediate frequency signal or a baseband signal into a frequency in an operating frequency range the same as those of the main power amplifier 202 and the first auxiliary power amplifier 203. The operating frequency range of the main power amplifier 202 and the first auxiliary power amplifier 203 is equivalent to a frequency range of a frequency band in which a transmitted signal is located. To be specific, a radio frequency signal is obtained by using the frequency converter 207, and a radio frequency signal obtained after frequency conversion is output to each of the main power amplifier 202 and the first auxiliary power amplifier 203.

In one embodiment, as shown in FIG. 3, the power amplification apparatus 200 may further include a power divider 206, connected to both the gate of the main power amplifier 202 and the gate of the first auxiliary power amplifier 203, and configured to: divide the radio frequency signal into two signals, and respectively output the two signals to the main power amplifier 202 and the first auxiliary power amplifier 203. In one embodiment, the two signals obtained by the power divider 206 through division are equal or unequal in energy.

In one embodiment, as shown in FIG. 3, the power amplification apparatus 200 may further include two more microstrips 204 that are both quarter-wave ($\lambda/4$) transmission lines. One microstrip 204 is configured between the gate of the main power amplifier 202 and the gate (namely, a signal input end) of the first auxiliary power amplifier 203, and can provide phase compensation between the main power amplifier 202 and the first auxiliary power amplifier 203. The other microstrip 204 is configured at a combiner output end of the main power amplifier 202 and the first auxiliary power amplifier 203.

It should be noted that the microstrip 204 in this embodiment of this application may be replaced by an impedance conversion network in another form. The first microstrip 204 may be replaced by another transmission line that can transmit the envelope voltage. In this embodiment of this application, an existing transmission line element in an existing system is used to transmit the envelope voltage, so that the envelope voltage is transferred between power transistors without increasing complexity of a system structure.

During actual application, the main power amplifier 202 and the first auxiliary power amplifier 203 may include one or more transistors or another similar circuit component. A person of ordinary skill in the art may learn that the main power amplifier 202 and the first auxiliary power amplifier 203 may be implemented by using any other known semiconductor technology in the prior art. This is not limited in this embodiment of this application.

In one embodiment, the power amplification apparatus 200 may further include another circuit component or structure. For example, a corresponding matching circuit is disposed at a drain of the main power amplifier 202 and/or a drain of the first auxiliary power amplifier 203. This is not limited in this application.

It may be understood that a quantity of auxiliary power amplifiers may be determined based on a system requirement. To be specific, a Doherty amplifier part in the power amplification apparatus provided in this embodiment of this application may be a multi-way Doherty power amplifier.

Figure 4A:
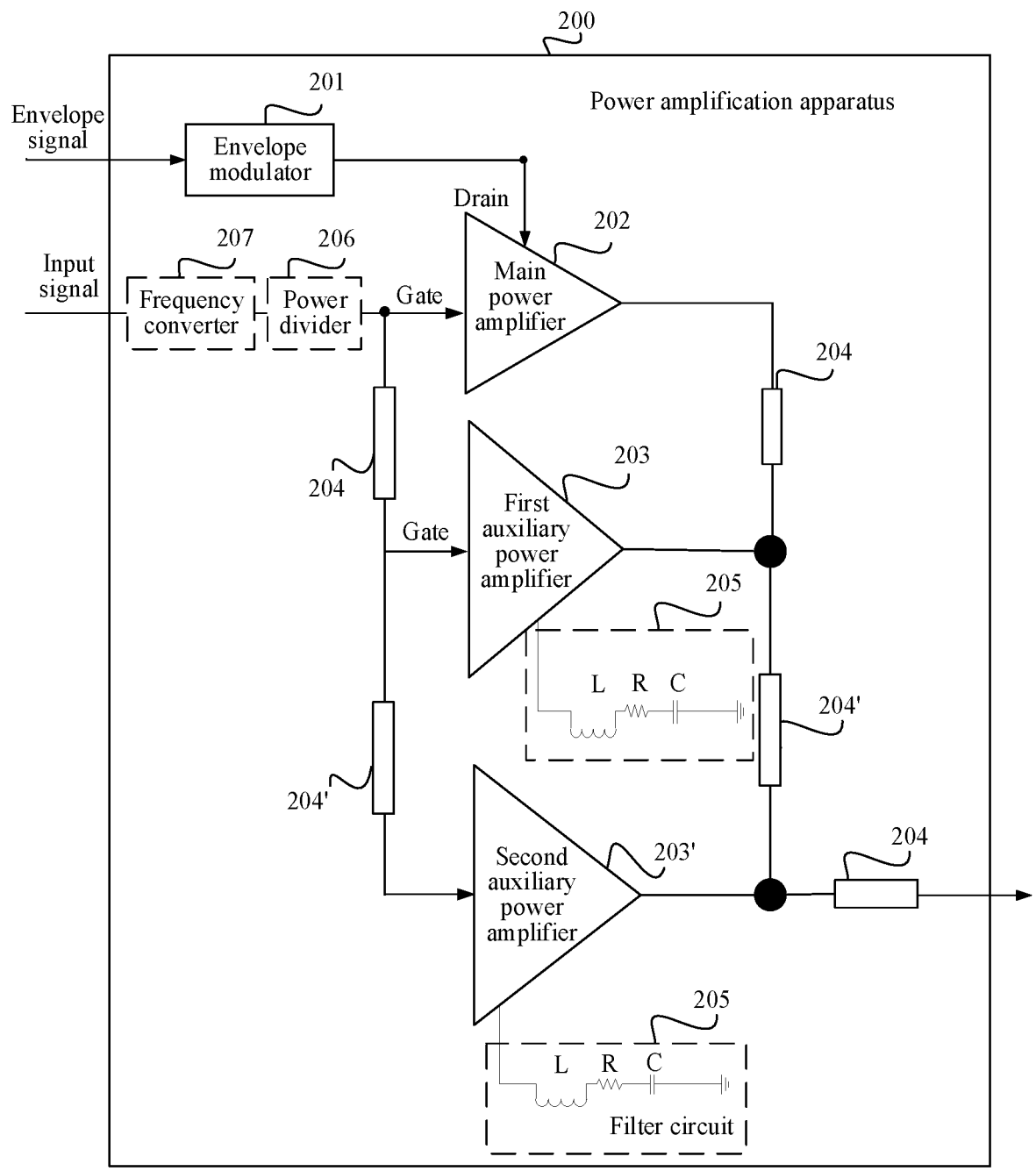
FIG. 4a is a third schematic structural diagram of a power amplifier according to an embodiment of this application.

For example, the power amplification apparatus 200 includes two auxiliary power amplifiers. As shown in FIG. 4a, the power amplification apparatus 200 further includes a second auxiliary power amplifier 203'. The second auxiliary power amplifier 203' is configured to perform amplification processing on a signal input through a gate of the second auxiliary power amplifier 203'. The second auxiliary power amplifier 203' is connected to the first auxiliary power amplifier 203, to use the envelope voltage received from the first auxiliary power amplifier 203 as an operating voltage. The first auxiliary power amplifier 203 is connected to the second auxiliary power amplifier 203', and is configured to output the envelope voltage to the second auxiliary power amplifier 203'.

In one embodiment, similar to the structure shown in FIG. 3, the second auxiliary power amplifier 203' is connected to one filter circuit 205, to filter the envelope voltage received by the second auxiliary power amplifier 203'.

In one embodiment, similar to the structure shown in FIG. 3, the output end of the first auxiliary power amplifier 203 is connected to the second auxiliary power amplifier 203' by using a microstrip 204', which may be marked as a second microstrip 204'. The second microstrip 204' is configured to transmit the envelope voltage.

In one embodiment, the frequency converter 207 is further connected to the gate of the second auxiliary power amplifier 203', and is configured to convert a frequency of an input signal into a frequency in an operating frequency range the same as those of the main power amplifier 202, the first auxiliary power amplifier 203, and the second auxiliary power amplifier 203', to obtain a radio frequency signal. The input signal of the frequency converter 207 may be an intermediate frequency signal or a baseband signal. The frequency converter 207 outputs the radio frequency signal obtained after frequency conversion to each of the main power amplifier 202, the first auxiliary power amplifier 203, and the second auxiliary power amplifier 203'.

In one embodiment, the power divider 206 is further configured to the gate of the second auxiliary power amplifier 203', and is configured to: divide the radio frequency signal into three signals, and respectively output the three signals to the main power amplifier 202, the first auxiliary power amplifier 203, and the second auxiliary power amplifier 203'.

Figure 1:
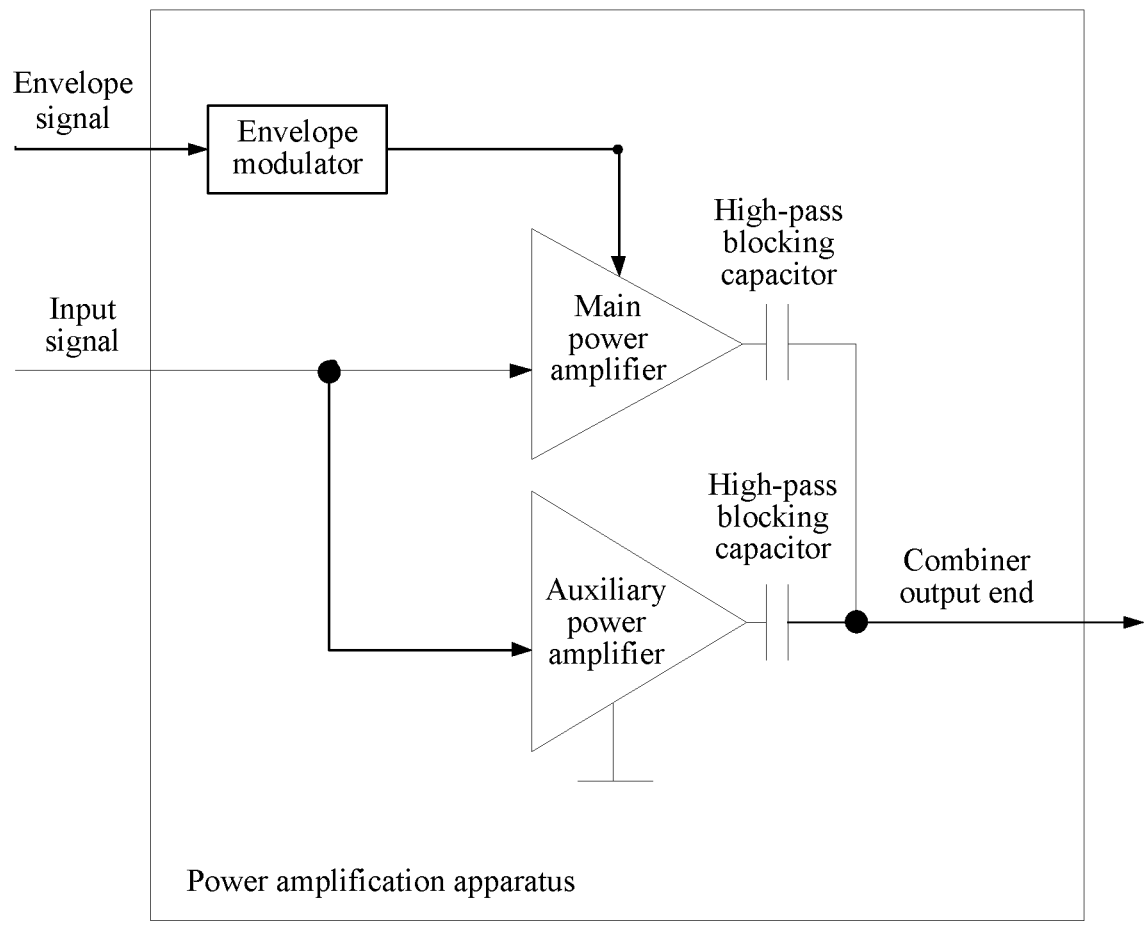
FIG. 1 is a schematic structural diagram of a power amplification system in the prior art.
Figures 1, 4B:
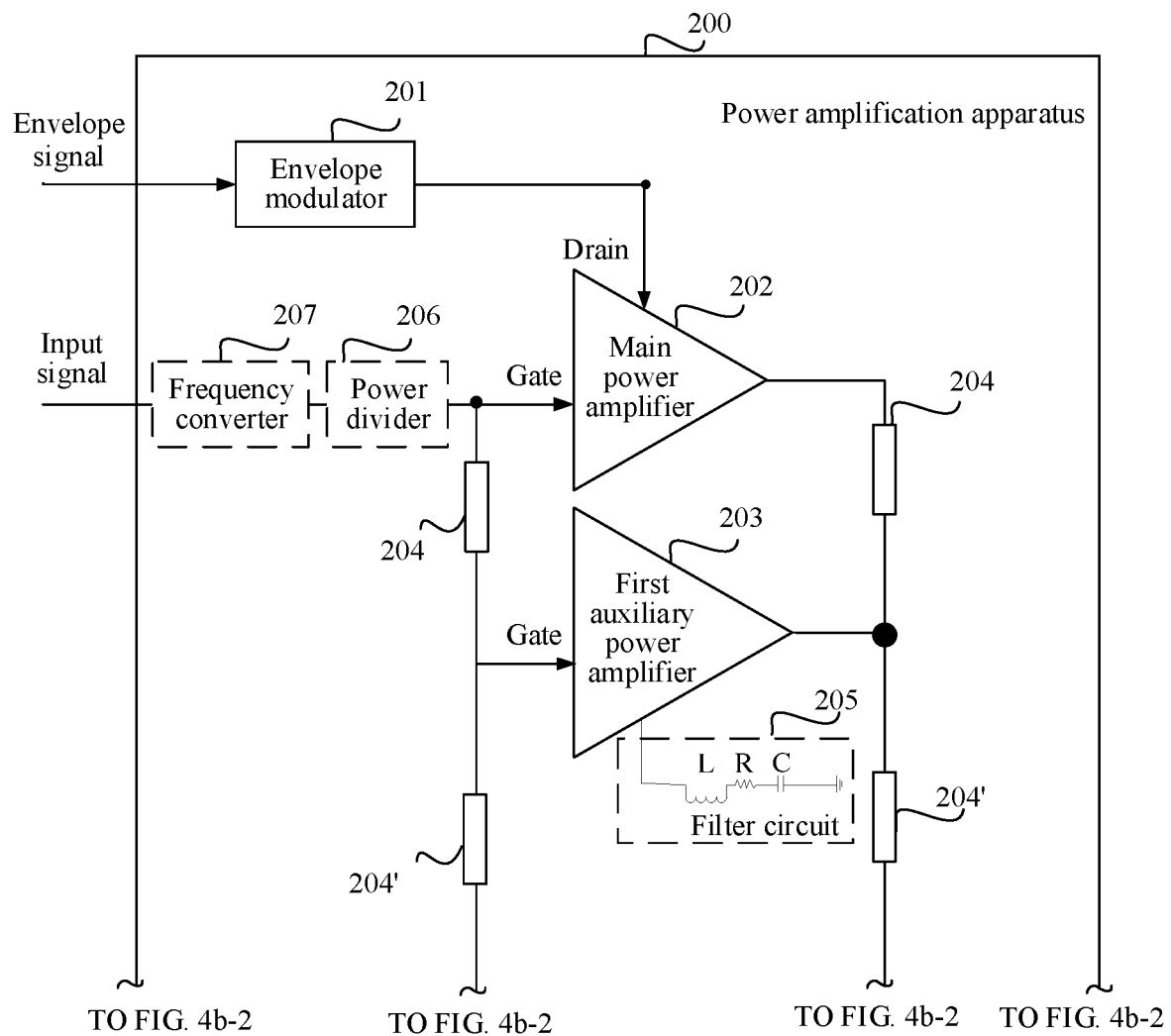
Figures 2, 4B:
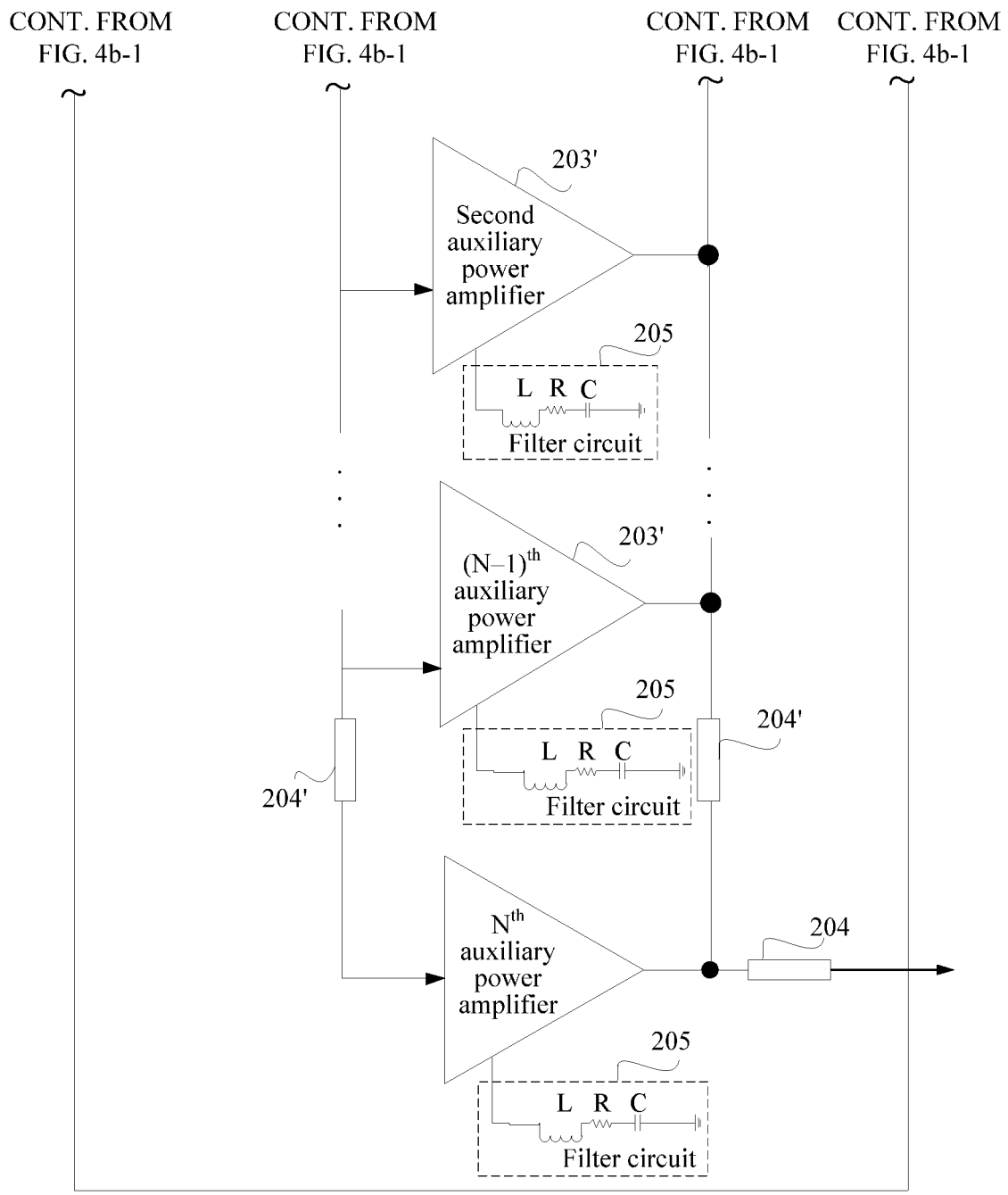

Certainly, the power amplification apparatus 200 may include more than two auxiliary power amplifiers 203'. A connection manner of the power amplification apparatus 200 is the same as the connection manner in which two auxiliary power amplifiers 203' are included in FIG. 4a. For details, as shown in FIG. 4b-1 and FIG. 4b-2, it is assumed that the power amplification apparatus 200 further includes the second auxiliary power amplifier 203' to an $N^{th}$ auxiliary power amplifier 203', where N is a positive integer greater than or equal to 3.

Each of the second auxiliary power amplifier 203' to the $(N-1)^{th}$ auxiliary power amplifier 203' is configured to perform amplification processing on a signal input through a gate of each auxiliary power amplifier 203'. The auxiliary power amplifier 203' is connected to a previous auxiliary power amplifier and a next auxiliary power amplifier, and is configured to: receive the envelope voltage output by the previous auxiliary power amplifier, output the envelope voltage to the next auxiliary power amplifier, and use the envelope voltage as an operating voltage in an operating state.

The $N^{th}$ auxiliary power amplifier 203' is configured to perform amplification processing on a signal input through a gate of the $N^{th}$ auxiliary power amplifier 203'. The $N^{th}$ auxiliary power amplifier 203' is connected to the $(N-1)^{th}$ auxiliary power amplifier 203', to use an envelope voltage received from the $(N-1)^{th}$ auxiliary power amplifier 203' as an operating voltage in an operating state.

In an architecture of the multi-way Doherty amplifier, at least one auxiliary power amplifier is connected to the filter circuit 205. For example, only the first auxiliary power amplifier 203 is connected to the filter circuit 205. For another example, each of the first auxiliary power amplifier 203 and the second auxiliary power amplifier 203' is connected to the filter circuit 205. Certainly, alternatively, each auxiliary power amplifier 203' is connected to one filter circuit 205. The filter circuit 205 is configured to filter the envelope voltage received by the auxiliary power amplifier 203'.

In one embodiment, similar to the structure shown in FIG. 3, one second microstrip 204' is connected between every two of the second auxiliary power amplifier 203' to the $N^{th}$ auxiliary power amplifier 203', to transmit the envelope voltage.

In one embodiment, for a plurality of auxiliary power amplifiers, the frequency converter 207 is further connected to the gate of the second auxiliary power amplifier 203' and the gate of the $N^{th}$ auxiliary power amplifier 203'. In the architecture of the multi-way Doherty amplifier, the frequency converter 207 is configured to convert a frequency of the input signal into a frequency in an operating frequency range the same as those of the main power amplifier 202 and any auxiliary power amplifier 203 or 203', to obtain the radio frequency signal. The input signal of the frequency converter 207 may be an intermediate frequency signal or a baseband signal. The frequency converter 207 outputs the radio frequency signal obtained after frequency conversion to each of the main power amplifier 202 and any auxiliary power amplifier 203 or auxiliary power amplifier 203'.

In one embodiment, for the plurality of auxiliary power amplifiers, the power divider 206 is further connected to the gate of the second auxiliary power amplifier 203' and the gate of the $N^{th}$ auxiliary power amplifier 203'. In the architecture of the multi-way Doherty amplifier, the power divider 206 is configured to: divide the radio frequency signal into (N+1) signals, and respectively output the (N+1) signals to the main power amplifier 202 and the first to the $N^{th}$ auxiliary power amplifiers 203 or 203'.

When structures of power amplification apparatuses shown in FIG. 4a, FIG. 4b-1, and FIG. 4b-2 are used, the quantity of the auxiliary power amplifiers is increased, so that a larger output power can be generated, and device performance can further be improved.

In another embodiment, the envelope modulator 201 may be connected to a side of any auxiliary power amplifier. To be specific, the envelope voltage output by the envelope modulator 201 is first transmitted to a drain of the connected auxiliary power amplifier, and is then transmitted to the main power amplifier 202 and another auxiliary power amplifier by using the connected auxiliary power amplifier. In one embodiment, the envelope modulator 201 may be connected to a side of an auxiliary power amplifier in the middle of an entire circuit architecture. Other structures and a signal processing process are the same as those in the embodiments shown in FIG. 2 to FIG. 4, and details are not described herein again.

Figure 5:
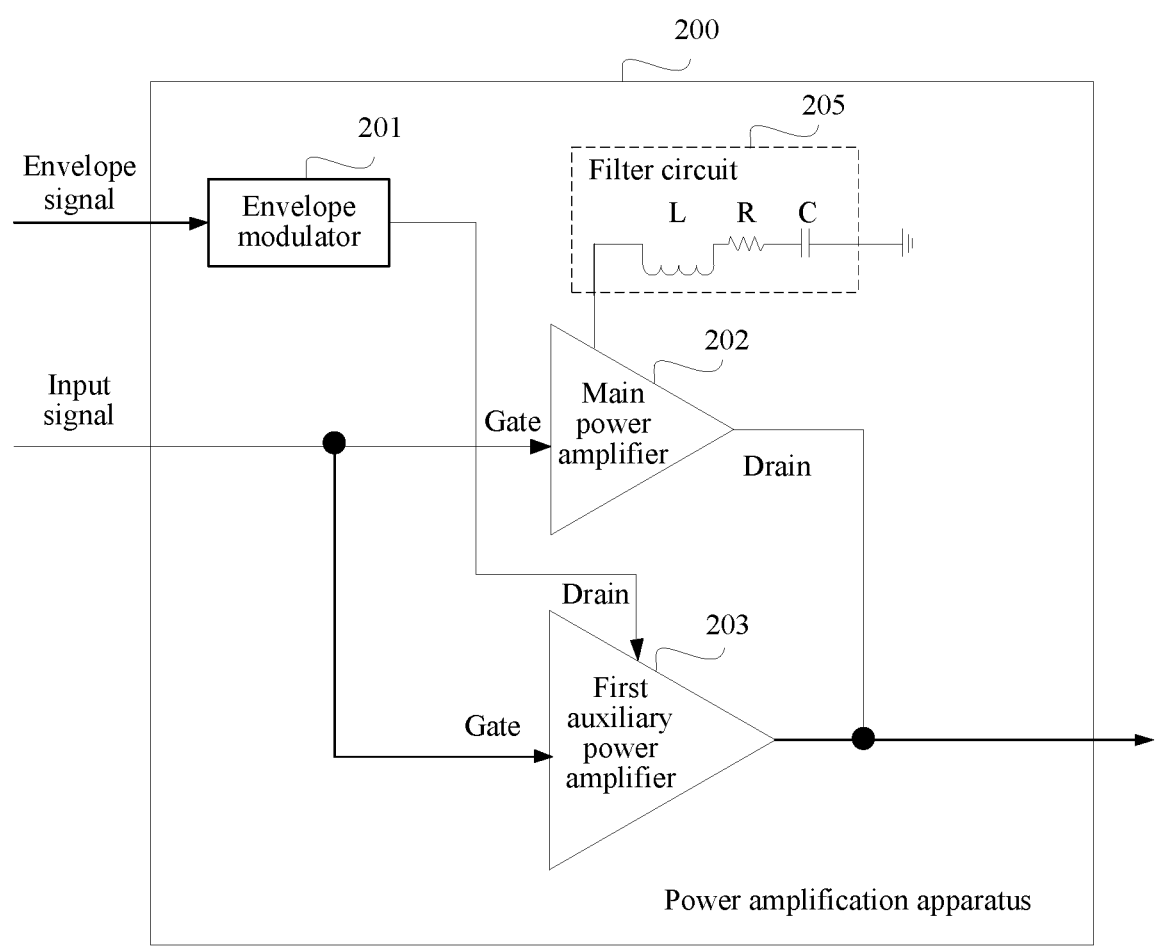
FIG. 5 is a fifth schematic structural diagram of a power amplifier according to an embodiment of this application.

For example, as shown in FIG. 5, the envelope modulator 201 may be mounted on a side of the first auxiliary power amplifier 203. The first auxiliary power amplifier 203 transmits the envelope voltage obtained from the envelope modulator 201 to the main power amplifier 202.

Specifically, the envelope modulator 201 is connected to the drain of the first auxiliary power amplifier 203, and is configured to: obtain an envelope voltage based on a received envelope signal, and output the envelope voltage to the drain of the first auxiliary power amplifier 203.

The first auxiliary power amplifier 203 performs amplification processing on a signal input through the gate of the first auxiliary power amplifier 203. The first auxiliary power amplifier 203 is connected to the envelope modulator 201, to use the envelope voltage received from the envelope modulator 201 as an operating voltage in an operating state. The first auxiliary power amplifier 203 is connected to the main power amplifier 202, and outputs the envelope voltage to the drain of the main power amplifier 202.

The main power amplifier 202 performs amplification processing on the signal input through the gate of the main power amplifier 202. The main power amplifier 202 is connected to the first auxiliary power amplifier 203, to use the envelope voltage received from the first auxiliary power amplifier 203 as an operating voltage in an operating state.

In one embodiment, the main power amplifier 202 is connected to the filter circuit 205, and configured to filter and shape a signal of the envelope voltage received by the main power amplifier 202, to improve an envelope waveform.

It should be noted that except that an output end of the envelope modulator 201 is connected to the first auxiliary power amplifier 203 instead of the main power amplifier 202, the remaining signal processing process is the same as that in the embodiment in FIG. 2. Repetitions are not described herein again.

It may be learned that the envelope modulator 201 may be flexibly positioned, so that a layout of the power amplification apparatus 200 is more flexible.

In conclusion, by using the power amplifier provided in the embodiments of this application, an envelope voltage is transferred between two power transistors, so that an envelope voltage output by an envelope modulator is transferred from a main power amplifier to an auxiliary power amplifier. The main power amplifier and the auxiliary power amplifier both use the envelope voltage output by the envelope modulator as an operating voltage. The envelope voltage varies by tracking an amplitude variation of an envelope signal, so that the power amplification apparatus operates in a Doherty amplifier mode of envelope tracking. Because operating voltages of the main power amplifier and the auxiliary power amplifier can be adjusted simultaneously, symmetry of the power amplification apparatus is improved, and efficiency loss is not likely to occur. An efficiency advantage of a Doherty amplifier during power back-off is used in combination with an envelope tracking technology, so that a saturation power of the power amplifier is increased, efficiency of the power amplification apparatus is improved, and in particular, in an operating state of amplifying a signal with a high power and a high peak-to-average power ratio, relatively high efficiency can be achieved. The envelope voltage may be transferred to both the main power amplifier and at least one auxiliary power amplifier by using one envelope modulator, so that an area and costs of the power amplifier are reduced. Components in the power amplification apparatus are positioned more flexibly, and a high-pass blocking capacitor is removed, so that it is easier to construct the power amplification apparatus. In addition, an auxiliary power amplifier is connected to one filter circuit, to filter a signal of the envelope voltage, so that transferred envelope voltages are closer or equal.

In one embodiment, the power amplification apparatus provided in the embodiments of this application may be integrated in at least one chip, for example, an application-specific integrated circuit (ASIC); or may include at least one discrete device; or may be a chip system. The chip system includes at least one chip and at least one discrete device. A specific implementation form of the power amplification apparatus is not limited in this application.

Figure 6:
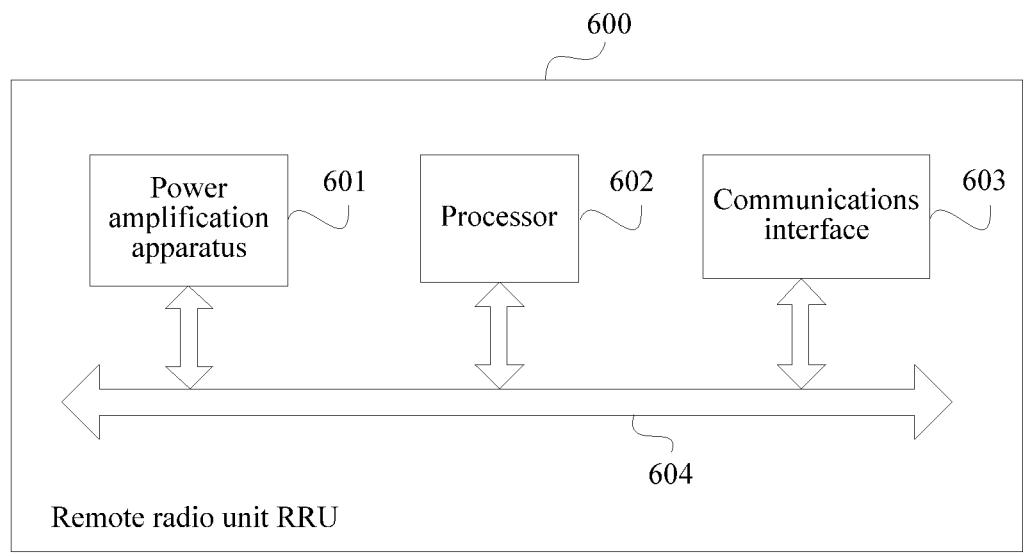
FIG. 6 is a schematic structural diagram of a remote radio unit according to an embodiment of this application.

As shown in FIG. 6, an embodiment of this application further provides a remote radio unit (RRU) 600, including a power amplification apparatus 601. The power amplification apparatus 601 may be the power amplification apparatus 200 shown in any one of FIG. 2 to FIG. 5 or an apparatus having the same functions. For an internal structure and functional descriptions of the power amplification apparatus 601, refer to descriptions of the foregoing embodiments of this application, and details are not described herein again.

The RRU 600 may further include a processor 602, configured to: extract an original envelope signal of a to-be-amplified radio frequency signal, obtain an envelope signal through preset function processing of the original envelope signal, and output the envelope signal to the power amplification apparatus 601. The power amplification apparatus 601 processes the envelope signal into the envelope voltage as an operating voltage of the power amplification apparatus.

In one embodiment, the processor 602 may further be configured to: generate a modulator control signal, and output the modulator control signal to the power amplification apparatus 601. The modulator control signal may be used to control an amplitude of the envelope voltage.

The processor 602 may directly or indirectly communicate with the power amplification apparatus 601.

It may be understood that the processor 602 may be separately disposed, or a function of the processor 602 may be integrated in an existing functional module of the RRU, for example, an intermediate frequency module or a transceiver module. This is not limited in this embodiment of this application. In an actual implementation, the function of the processor 602 may be integrated on a baseband chip.

The RRU 600 may further include a communications interface 603, configured to directly or indirectly communicate with another apparatus in the base station, for example, a baseband unit (BBU).

In one embodiment, the communications interface 603 may be a common public radio interface (CPRI), an open base station architecture initiative (OBASI) interface, or the like.

In one embodiment, the RRU 600 may alternatively receive the envelope signal and/or the modulator control signal from the BBU by using the communications interface.

A connection manner of the power amplification apparatus 601, the processor 602, and the communications interface 603 is not limited. As shown in FIG. 6, the power amplification apparatus 601, the processor 602, and the communications interface 603 may be connected by using the communications bus 604, to transmit a signal.

For clarity and brevity of description, in this embodiment of this application, a power amplification apparatus is configured in the RRU for description. A person skilled in the art may understand that the power amplification apparatus may be alternatively configured in another similar radio frequency functional module. This is not limited in this embodiment of this application.

Figure 7:
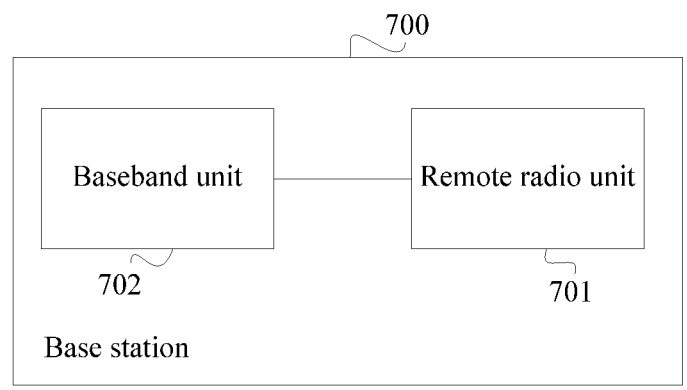
FIG. 7 is a schematic structural diagram of a base station according to an embodiment of this application.

As shown in FIG. 7, an embodiment of this application further provides a base station 700. The base station 700 includes a remote radio unit 701 and a baseband unit 702. The remote radio unit 701 may be the remote radio unit shown in FIG. 6 or a device having the same functions. The remote radio unit 701 may directly or indirectly communicate with the baseband unit 702.

By using the remote radio unit or the base station provided in the embodiments of this application, a power amplification apparatus part uses a manner in which a main power amplifier and an auxiliary power amplifier transfer the envelope voltage. The main power amplifier and the auxiliary power amplifier both use the envelope voltage output by the envelope modulator as an operating voltage. The envelope voltage varies by tracking an amplitude variation of an envelope signal, so that the power amplification apparatus operates in a Doherty amplifier mode of envelope tracking. Because operating voltages of the main power amplifier and the auxiliary power amplifier can be adjusted simultaneously, symmetry of the power amplification apparatus is improved, and efficiency loss is not likely to occur. An efficiency advantage of a Doherty amplifier during power back-off is used in combination with an envelope tracking technology, so that a saturation power of the power amplifier is increased, efficiency of the power amplification apparatus is improved, and in particular, in an operating state of amplifying a signal with a high power and a high peak-to-average power ratio, relatively high efficiency can be achieved.

A person skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by a computer or a processor of another programmable data processing device generate an apparatus for implementing a specific function in one or more processes in the flowcharts and/or in one or more blocks in the block diagrams.

These computer program instructions may be stored in a computer readable memory that can instruct the computer or another programmable data processing device to operate in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Obviously, a person skilled in the art can make various modifications and variations to the embodiments of this application without departing from the spirit and scope of the embodiments of this application. This application is intended to cover these modifications and variations made to the embodiments of this application provided that they fall within the scope defined by the claims of this application and their equivalent technologies.

What is claimed is:

1. A power amplification apparatus, comprising an envelope modulator, a main power amplifier, and a first auxiliary power amplifier, wherein
    the envelope modulator is connected to a drain of the main power amplifier, and is configured to: obtain an envelope voltage based on a received envelope signal, and output the envelope voltage to the drain of the main power amplifier;
    the main power amplifier is configured to perform amplification processing on a signal input through a gate of the main power amplifier, the main power amplifier is connected to the envelope modulator, to use the envelope voltage received from the envelope modulator as an operating voltage, and the main power amplifier is connected to the first auxiliary power amplifier, and is configured to output the envelope voltage to a drain of the first auxiliary power amplifier, wherein the envelope voltage tracks a magnitude variation of the envelope signal and the main power amplifier operates in an approximately saturated operating state based on the envelope voltage; and
    the first auxiliary power amplifier is configured to perform amplification processing on a signal input through a gate of the first auxiliary power amplifier, and the first auxiliary power amplifier is connected to the main power amplifier, to use the envelope voltage received from the main power amplifier as an operating voltage.

2. The power amplification apparatus according to claim 1, further comprising:
    a second auxiliary power amplifier, configured to perform amplification processing on a signal input through a gate of the second auxiliary power amplifier, wherein the second auxiliary power amplifier is connected to the first auxiliary power amplifier, to use the envelope voltage received from the first auxiliary power amplifier as an operating voltage, wherein
    the first auxiliary power amplifier is connected to the second auxiliary power amplifier, and outputs the envelope voltage to the second auxiliary power amplifier.

3. The power amplification apparatus according to claim 1, further comprising:
    a filter circuit, connected to the drain of the first auxiliary power amplifier, and configured to filter the envelope voltage received by the first auxiliary power amplifier.

4. The power amplification apparatus according to claim 3, wherein the filter circuit comprises at least one of an inductor, a resistor, and a capacitor, and the filter circuit is grounded.

5. The power amplification apparatus according to claim 1, wherein that the main power amplifier is connected to the first auxiliary power amplifier comprises:
    an output end of the main power amplifier is connected to an output end of the first auxiliary power amplifier using a first microstrip, and the first microstrip is configured to transmit the envelope voltage.

6. The power amplification apparatus according to claim 1, further comprising:
    a frequency converter, connected to both the gate of the main power amplifier and the gate of the first auxiliary power amplifier, and configured to convert a frequency of an input signal into a frequency in an operating frequency range the same as those of the main power amplifier and the first auxiliary power amplifier, to obtain a radio frequency signal, and output the radio frequency signal to each of the main power amplifier and the first auxiliary power amplifier.

7. The power amplification apparatus according to claim 6, further comprising:
   a power divider, connected to both the gate of the main power amplifier and the gate of the first auxiliary power amplifier, and configured to: divide the radio frequency signal into at least two signals, and respectively output two of the at least two signals to the main power amplifier and the first auxiliary power amplifier.

8. The power amplification apparatus according to claim 2, wherein that the first auxiliary power amplifier is connected to the second auxiliary power amplifier comprises:
   an output end of the first auxiliary power amplifier is connected to an output end of the second auxiliary power amplifier using a second microstrip, and the second microstrip is configured to transmit the envelope voltage.

9. A radio unit of a network device, comprising a power amplification apparatus, wherein the power amplification apparatus comprises an envelope modulator, a main power amplifier, and a first auxiliary power amplifier, and wherein
   the envelope modulator is connected to a drain of the main power amplifier, and is configured to: obtain an envelope voltage based on a received envelope signal, and output the envelope voltage to the drain of the main power amplifier;
   the main power amplifier is configured to perform amplification processing on a signal input through a gate of the main power amplifier, the main power amplifier is connected to the envelope modulator, to use the envelope voltage received from the envelope modulator as an operating voltage, and the main power amplifier is connected to the first auxiliary power amplifier, and is configured to output the envelope voltage to a drain of the first auxiliary power amplifier, wherein the envelope voltage tracks a magnitude variation of the envelope signal and the main power amplifier operates in an approximately saturated operating state based on the envelope voltage; and
   the first auxiliary power amplifier is configured to perform amplification processing on a signal input through a gate of the first auxiliary power amplifier, and the first auxiliary power amplifier is connected to the main power amplifier, to use the envelope voltage received from the main power amplifier as an operating voltage.

10. The radio unit according to claim 9, wherein the power amplification apparatus further comprises:
    a second auxiliary power amplifier, configured to perform amplification processing on a signal input through a gate of the second auxiliary power amplifier, wherein the second auxiliary power amplifier is connected to the first auxiliary power amplifier, to use the envelope voltage received from the first auxiliary power amplifier as an operating voltage, wherein
    the first auxiliary power amplifier is connected to the second auxiliary power amplifier, and outputs the envelope voltage to the second auxiliary power amplifier.

11. The radio unit according to claim 9, wherein the power amplification apparatus further comprises:
    a filter circuit, connected to the drain of the first auxiliary power amplifier, and configured to filter the envelope voltage received by the first auxiliary power amplifier.

12. The radio unit according to claim 11, wherein the filter circuit comprises at least one of an inductor, a resistor, and a capacitor, and the filter circuit is grounded.

13. The radio unit according to claim 9, wherein that the main power amplifier is connected to the first auxiliary power amplifier comprises:
    an output end of the main power amplifier is connected to an output end of the first auxiliary power amplifier by using a first microstrip, and the first microstrip is configured to transmit the envelope voltage.

14. The radio unit according to claim 9, wherein the power amplification apparatus further comprises:
    a frequency converter, connected to both the gate of the main power amplifier and the gate of the first auxiliary power amplifier, and configured to convert a frequency of an input signal into a frequency in an operating frequency range the same as those of the main power amplifier and the first auxiliary power amplifier, to obtain a radio frequency signal, and output the radio frequency signal to each of the main power amplifier and the first auxiliary power amplifier.

15. The radio unit according to claim 14, wherein the power amplification apparatus further comprises:
    a power divider, connected to both the gate of the main power amplifier and the gate of the first auxiliary power amplifier, and configured to: divide the radio frequency signal into at least two signals, and respectively output two of the at least two signals to the main power amplifier and the first auxiliary power amplifier.

16. The radio unit according to claim 10, wherein that the first auxiliary power amplifier is connected to the second auxiliary power amplifier comprises:
    an output end of the first auxiliary power amplifier is connected to an output end of the second auxiliary power amplifier by using a second microstrip, and the second microstrip is configured to transmit the envelope voltage.

17. A network device, comprising a radio unit, the radio unit comprising a power amplification apparatus, wherein the power amplification apparatus comprises an envelope modulator, a main power amplifier, and a first auxiliary power amplifier, and wherein
    the envelope modulator is connected to a drain of the main power amplifier, and is configured to: obtain an envelope voltage based on a received envelope signal, and output the envelope voltage to the drain of the main power amplifier;
    the main power amplifier is configured to perform amplification processing on a signal input through a gate of the main power amplifier, the main power amplifier is connected to the envelope modulator, to use the envelope voltage received from the envelope modulator as an operating voltage, and the main power amplifier is connected to the first auxiliary power amplifier, and is configured to output the envelope voltage to a drain of the first auxiliary power amplifier, wherein the envelope voltage tracks a magnitude variation of the envelope signal and the main power amplifier operates in an approximately saturated operating state based on the envelope voltage; and
    the first auxiliary power amplifier is configured to perform amplification processing on a signal input through a gate of the first auxiliary power amplifier, and the first auxiliary power amplifier is connected to the main power amplifier, to use the envelope voltage received from the main power amplifier as an operating voltage.

18. The network device according to claim 17, wherein the power amplification apparatus further comprises:
- a second auxiliary power amplifier, configured to perform amplification processing on a signal input through a gate of the second auxiliary power amplifier, wherein the second auxiliary power amplifier is connected to the first auxiliary power amplifier, to use the envelope voltage received from the first auxiliary power amplifier as an operating voltage, wherein
- the first auxiliary power amplifier is connected to the second auxiliary power amplifier, and outputs the envelope voltage to the second auxiliary power amplifier.

19. The network device according to claim 17, wherein the power amplification apparatus further comprises:
- a filter circuit, connected to the drain of the first auxiliary power amplifier, and configured to filter the envelope voltage received by the first auxiliary power amplifier.

20. The network device according to claim 19, wherein the filter circuit comprises at least one of an inductor, a resistor, and a capacitor, and the filter circuit is grounded.

* * * * *